(12) United States Patent
Stamper et al.

(10) Patent No.: US 6,838,355 B1
(45) Date of Patent: Jan. 4, 2005

(54) DAMASCENE INTERCONNECT STRUCTURES INCLUDING ETCHBACK FOR LOW-K DIELECTRIC MATERIALS

(75) Inventors: Anthony K. Stamper, Williston, VT (US); Edward C. Cooney, III, Jericho, VT (US); Jeffrey P. Gambino, Westfort, VT (US); Timothy J. Dalton, Ridgefield, CT (US); John A. Fitzsimmons, Poughkeepsie, NY (US); Lee M. Nicholson, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,602

(22) Filed: Aug. 4, 2003

(51) Int. Cl.$^7$ .............................................. H01L 21/76
(52) U.S. Cl. ...................... 438/409; 438/411; 438/421; 438/422; 438/424; 438/427; 438/428; 438/432; 438/435; 438/619; 438/624; 438/637; 438/687
(58) Field of Search ................................ 438/409, 411, 438/421–422, 424, 427–428, 432, 435, 619, 624, 637, 687

(56) References Cited

U.S. PATENT DOCUMENTS

| | | | | |
|---|---|---|---|---|
| 6,121,126 A | * | 9/2000 | Ahn et al. ................... 438/602 |
| 6,184,121 B1 | * | 2/2001 | Buchwalter et al. ........ 438/622 |
| 6,239,016 B1 | * | 5/2001 | Ishikawa .................... 438/619 |
| 6,331,481 B1 | | 12/2001 | Stamper et al. |
| 6,413,852 B1 | * | 7/2002 | Grill et al. ................... 438/619 |
| 6,413,854 B1 | | 7/2002 | Uzoh et al. |

\* cited by examiner

*Primary Examiner*—Lynne A. Gurley
(74) *Attorney, Agent, or Firm*—Margaret A. Pepper

(57) ABSTRACT

A method for forming back-end-of-line (BEOL) interconnect structures in disclosed. The method and resulting structure includes etchback for low-k dielectric materials. Specifically, a low dielectric constant material is integrated into a dual or single damascene wiring structure which contains a dielectric material having relatively high dielectric constant (i.e., 4.0 or higher). The damascene structure comprises the higher dielectric constant material immediately adjacent to the metal interconnects, thus benefiting from the mechanical characteristics of these materials, while incorporating the lower dielectric constant material in other areas of the interconnect level.

40 Claims, 8 Drawing Sheets

DAMASCENE INTERCONNECT STRUCTURES INCLUDING ETCHBACK FOR LOW-K DIELECTRIC MATERIALS

BACKGROUND OF INVENTION

This invention relates to the formation of backend-of-line (BEOL) interconnect structures in integrated circuits. More particularly, this invention relates to new damascene interconnect structures including etchback for low-k dielectric materials, and new methods of forming these interconnect structures.

The semiconductor industry roadmap calls for lowering the dielectric constant on the insulation surrounding multi-level on-chip interconnects. The dielectric constant must be lowered so as to reduce the parasitic capacitive load to the integrated circuits, as well as to reduce the capacitive coupling between neighboring interconnects.

Reducing dielectric constant often comes with a concomitant reduction in insulator mechanical properties such as modulus, hardness, thermal conductivity and fracture toughness. Significant stresses can develop in the structure due to thermal expansion mismatches with the substrate and the metal interconnects. These stresses can cause fatigue of copper vias or studs during thermal cycling, resulting in yield or reliability problems. A method is therefore needed to provide the strength characteristics of dielectric materials having higher dielectric constant immediately adjacent to copper vias or studs, while providing dielectric materials having lower dielectric constant in other areas of the interconnect level.

U.S. Pat. No. 6,331,481 to Stamper et al., the disclosure of which is incorporated herein by reference, discloses a method of integrating a low dielectric material into a dual or single damascene wiring structure which contains a dielectric material having a higher dielectric constant. This integration is achieved by employing the step of etching back the higher dielectric constant material to expose regions of in-laid wiring present in the damascene structure. The Stamper et al. method is shown in FIGS. 5(a)–5(e), which correspond to FIGS. 1(A)–1(E) in the Stamper et al. patent. The method begins with a typical dual damascene structure such as that shown in FIG. 5(a), including dielectric 52 and in-laid wiring 54. This damascene structure is then etched back so as to expose regions of in-laid wiring 54, as shown in FIG. 5(b). A polish stop layer 56 is then optionally deposited over the exposed regions of the structure, as shown in FIG. 5(c). Finally, a second dielectric material 58 is deposited onto the etchback structure or polish stop layer 56, and is then planarized, as shown in FIGS. 5(d)–5(e). The second dielectric material 58 has a dielectric constant lower than the first dielectric material 52, thereby lowering the overall dielectric constant of the interconnect level.

The method and resulting structure of the Stamper et al. patent has the following drawbacks. First, the copper wiring 54 is exposed during the etchback, which could result in erosion. Second, the copper may undergo silicidization during exposure to the etchback process, resulting in higher resistivity. Finally, exposing the sidewalls of the copper wiring 54 during etchback of the first dielectric material 52 may result in loss of wire sidewall mechanical support, which may cause the wire to "flop over" or may cause other mechanical integrity issues. Deposition of the optional polish stop layer 56 protects the copper wiring 54 from erosion or silicidization during etchback, but does not address the mechanical integrity issues. Moreover, deposition of this polish stop layer 56 is a costly additional step in the process.

Therefore, there remains a need in the art for a method of forming a damascene interconnect structure utilizing etchback and deposition of a second, lower dielectric constant material, but which does not suffer from the drawbacks of the prior art.

SUMMARY OF INVENTION

It is therefore an object of this invention to provide a damascene interconnect structure benefiting from the mechanical characteristics of higher dielectric constant materials immediately adjacent to the metal interconnects, while incorporating lower dielectric constant materials in other areas of the interconnect level.

The interconnect structure of this invention is formed by a method comprising the steps of: depositing at least one dielectric layer on the substrate, the dielectric layer being formed of at least one first dielectric material; embedding at least one conductive interconnect in the dielectric layer, the conductive interconnect having sidewalls in contact with the first dielectric material; removing a portion of the first dielectric material in selected areas of the dielectric layer, thereby forming at least one opening in the dielectric layer, such that the sidewalls of the conductive interconnect remain in contact with the first dielectric material; and filling the opening with a second dielectric material.

This method results in an interconnect structure comprising: a dielectric layer comprising at least one first portion and at least one second portion, the first portion comprising a first dielectric material and having a bottom surface, sidewalls and a top surface, and the second portion comprising a second dielectric material and having a bottom surface, sidewalls and a top surface, wherein the sidewalls of the second portion are in contact with the first portion; and at least one conductive interconnect embedded in the first portion, the conductive interconnect having sidewalls in contact with the first dielectric material but not in contact with the second dielectric material.

In one embodiment of this method, the conductive interconnect has a top surface coplanar with the top surface of the dielectric layer. The portion of the first dielectric material is removed by a method comprising the steps of: forming a cap on each conductive interconnect, the cap having a lateral extent greater than that of the conductive interconnect, thereby masking portions of the dielectric layer adjacent to the conductive interconnect and leaving other portions of the dielectric layer not masked; and removing a portion of the first dielectric material in areas of the dielectric layer not masked by the cap, thereby forming at least one opening in the dielectric layer.

In another embodiment of this method, the conductive interconnect has a top surface and sidewalls, and the top surface is higher than the top surface of the first dielectric material, thereby exposing a top portion of the sidewalls. The portion of the first dielectric material is removed by a method comprising the steps of: forming a cap on the top surface and exposed sidewalls of each conductive interconnect, the cap having a lateral extent greater than that of the conductive interconnect, thereby masking portions of the dielectric layer adjacent to each conductive interconnect and leaving other portions of the dielectric layer not masked; and removing a portion of the first dielectric material in areas of the dielectric layer not masked by the cap, thereby forming at least one opening in the dielectric layer.

In yet another embodiment of this method, the at least one dielectric layer comprises a layer of a first dielectric material deposited on the substrate and a layer of a third dielectric material deposited on the layer of first dielectric material. The conductive interconnect is embedded in the dielectric layer by a method comprising the steps of: forming at least one first opening in the layers of first and third dielectric materials; removing portions of the layer of third dielectric material adjacent to the first opening, thereby exposing portions of the top surface of the layer of first dielectric material; and filling the first opening with a conductive material, thereby forming at least one conductive interconnect, the conductive interconnect having a top surface coplanar with the top surface of the layer of third dielectric material, and a top portion having a lateral extent greater than that of lower portions of the conductive interconnect, thereby masking portions of the layer of first dielectric material adjacent to each conductive interconnect and leaving the layer of third dielectric material and other portions of the layer of first dielectric material not masked. The portion of the first dielectric material is removed by a method comprising the step of: removing the layer of third dielectric material and a portion of the first dielectric material in areas of the layer of first dielectric material not masked by the top portion of the conductive interconnect, thereby forming at least one second opening in the dielectric layer.

In yet another embodiment of this method, the conductive interconnect is embedded in the dielectric layer by a method comprising the steps of: forming at least one first opening in the dielectric layer; removing a top portion of the dielectric material adjacent to the first opening, thereby rounding top corners of the first opening; and filling the first opening with a conductive material, thereby forming at least one conductive interconnect, the conductive interconnect having a top surface coplanar with the top surface of the dielectric layer, and a top portion having a lateral extent greater than that of lower portions of the conductive interconnect, thereby masking portions of the dielectric layer adjacent to the conductive interconnect and leaving other portions of the dielectric layer not masked. The portion of the first dielectric material is removed by a method comprising the step of: removing a portion of the first dielectric material in areas of the dielectric layer not masked by the top portion of the conductive interconnect, thereby forming at least one second opening in the dielectric layer.

BRIEF DESCRIPTION OF DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION

The invention will now be described by reference to the accompanying figures. In the figures, various aspects of the structures have been shown and schematically represented in a simplified manner to more clearly describe and illustrate the invention. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the invention is not limited to constructions of any particular shape.

Figure 5A:
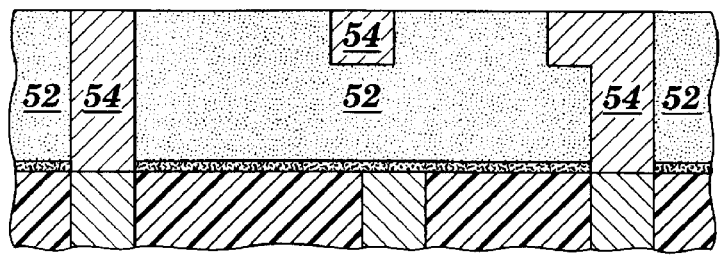
FIGS. 5(a)–5(e) illustrate a prior art method for forming an interconnect structure.
Figure 5B:
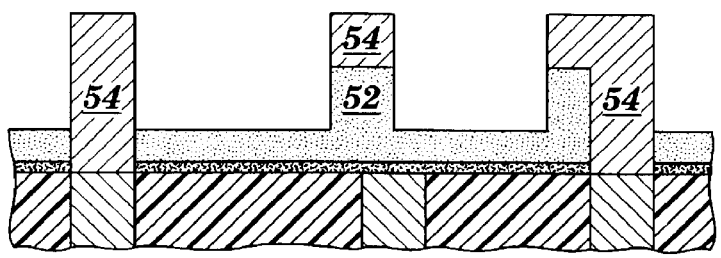
Figure 5C:
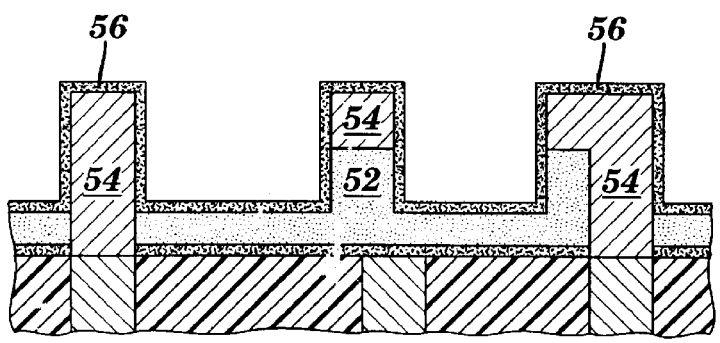
Figure 5D:
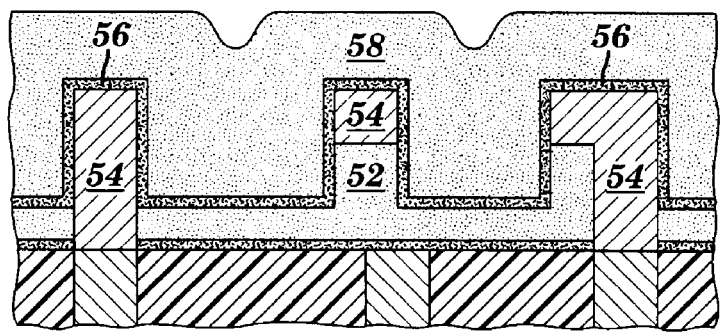
Figure 5E:
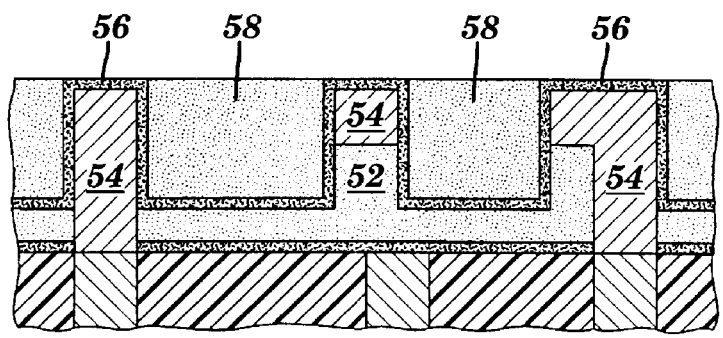

By using the method of this invention, the need for a polish stop layer or barrier layer, such as layer 56 in FIG. 5(c), is eliminated when using the conductors as a mask for etchback of a dielectric, to be filled with a lower k dielectric.

In general, the method of this invention comprises the steps of: depositing at least one dielectric layer on the substrate, the dielectric layer being formed of at least one first dielectric material; embedding at least one conductive interconnect in the dielectric layer, the conductive interconnect having sidewalls in contact with the first dielectric material; removing a portion of the first dielectric material in selected areas of the dielectric layer, thereby forming at least one opening in the dielectric layer, such that the sidewalls of the conductive interconnect remain in contact with the first dielectric material; and filling the opening with a second dielectric material. This method results in an interconnect structure comprising: a dielectric layer comprising at least one first portion and at least one second portion, the first portion comprising a first dielectric material and having a bottom surface, sidewalls and a top surface, and the second portion comprising a second dielectric material and having a bottom surface, sidewalls and a top surface, wherein the sidewalls of the second portion are in contact with the first portion; and at least one conductive interconnect embedded in the first portion, the conductive interconnect having sidewalls in contact with the first dielectric material but not in contact with the second dielectric material.

A first embodiment of the invention is shown in FIGS. 1(a)–1(d). The starting point for the method is an interconnect layer 11 on substrate 10. Substrate 10 may comprise lower levels of conductive interconnects or devices embedded in dielectric material (not shown). Interconnect layer 11 comprises a first dielectric material 12 and has at least one conductive interconnect 13 embedded therein. Conductive interconnect 13 has a top surface which is coplanar with the top surface of layer 11. The term "coplanar" throughout this application refers to a surface which is less than 50 nm above or below another surface. Thus, conductive interconnect 13 has a top surface which is less than 50 nm above or below the top surface of layer 11.

The dielectric material 12 may be any suitable dielectric material, but is preferably one or more materials having a relatively high dielectric constant, such as $SiO_2$, fluorosilicate glass (FSG) or SiCOH, so as to provide relatively good mechanical support for the conductive interconnects 13. Layer 11 may also contain thin (<100 nm) layers of $SiC_x$-$N_yH_z$ under, embedded or on the surface of dielectric 12, where x, y and z may be, independently, a number greater than or equal to 0. Conductive interconnects 13 may be formed of any suitable conductive material, but are preferably formed of copper. Other suitable conductive materials include but are not limited to: Al, AlCu, AlCuSi, Sn, Pb, W, WSi, Si and Ag. Conductive interconnects 13 preferably include a thin refractory metal liner followed by a thick bulk conductor, as known in the art and discussed in the Stamper et al. patent.

Layer 11, including dielectric material 12 and embedded conductive interconnect 13, may be formed using a conventional dual damascene technique. For example, a dielectric reactive ion etch (RIE) stop layer (not shown) and dielectric material 12 are deposited onto substrate 10. Next, openings for conductive interconnects 13 are patterned and etched into dielectric 12. Finally, the openings are filled with conductive material 13 and damascened into dielectric material 12. The metal lines and vias can be formed into the insulator material by using conventional lithographic techniques which include, but are not limited to: depositing a layer of resist on insulator material 12, patterning the resist to form a mask over the insulator material 12, etching (RIE) the unmasked areas to provide openings for the metal conductors 13, and stripping the resist.

The metal lines, i.e. wiring, and vias are filled with a conductive material using conventional deposition techniques, including but not limited to: chemical vapor deposition (CVD), sputtering, electroless deposition, electroplating, plasma vapor deposition and the like. Conductive interconnects 13 are thereafter planarized by using any conventional planarization technique, including but not limited to: chemical-mechanical polishing (CMP) or RIE etchback.

Following planarization of conductive interconnects 13, a cap 14 is formed on each interconnect 13. The cap 14 has a lateral extent greater than that of the conductive interconnect 13, thereby masking portions of the dielectric layer adjacent to each conductive interconnect and leaving other portions of the dielectric layer unmasked. The cap 14 preferably extends about 10 nm to about 50 nm beyond the top edge of the interconnect 13, and can act as a hardmask for subsequent blanket (i.e., unpatterned) etchback of the dielectric 12. The cap 14 may be formed by any suitable technique. The cap 14 also may be formed of any suitable material. For example, cap 14 may be formed of CoNiP or CoWP, by selective electroless plating. Alternatively, cap 14 may be formed of tungsten, by selective CVD metal deposition. In another alternative, cap 14 may be formed of a selectively deposited dielectric. In yet another alternative, cap 14 may be composed of a conductive or dielectric layer which is lithographically patterned and etched. After deposition of the cap material, an etchback step may optionally be employed to remove cap material in areas not adjacent to interconnects 13.

Figure 1A:
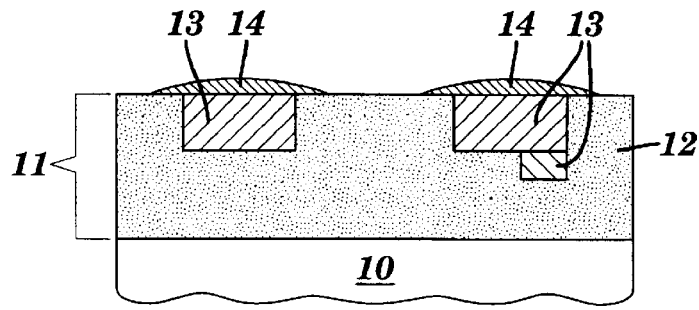
FIGS. 1(a)–1(d) illustrate a method for forming an interconnect structure in accordance with one embodiment of the present invention.
Figure 1B:
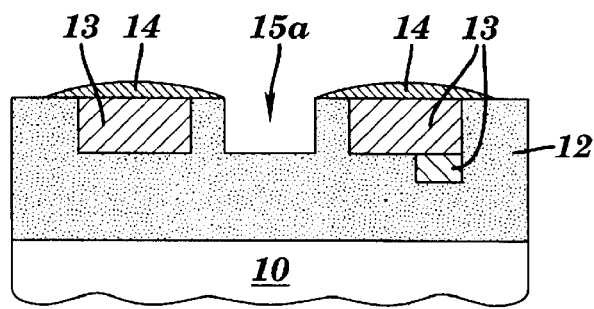

Next, a portion of first dielectric material 12 is removed in areas of layer 11 not masked by cap 14, thereby forming at least one opening 15 a, as shown in FIG. 1(b). Opening 15a is shown as a partial opening, i.e., not extending through the entire thickness of layer 11 and therefore not exposing substrate 10. However, as an alternative embodiment, opening 15a may extend through layer 11 to expose substrate 10. Etching is preferably carried out using any anisotropic or isotropic etch technique well know to those skilled in the art. Suitable anisotropic etching techniques include dry etching techniques and/or wet chemical etching techniques, with dry RIE being the most preferred, using methods similar to those discussed in the Stamper et al. patent. Since interconnects 13 are not exposed during etchback, it is not required that the etch technique employed be either non-corrosive to the conductive material in in-laid wiring 13 or be incapable of forming a surface oxide with the conductive material. Moreover, since interconnects 13 remain encapsulated in first dielectric material 12, it is not necessary to deposit any polish stop layer or barrier layer over exposed interconnects prior to depositing second dielectric material 15.

Figure 1C:
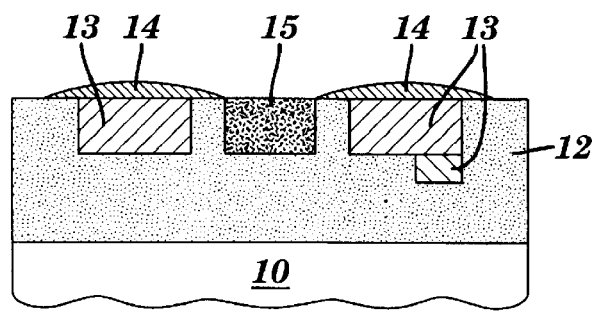

After forming openings 15a and cleaning the wafer as discussed in the Stamper et al. patent, a second dielectric material 15 is deposited onto the etchback structure, as shown in FIG. 1(c). Second dielectric material 15 preferably has a lower dielectric constant than that of first dielectric material 12. Second dielectric material 15 preferably has an effective dielectric constant less than about 4.0, more preferably about 1.3 to about 3.5. Suitable dielectric materials having an effective dielectric constant below 4.0 include, but are not limited toamorphous carbon, fluorinated amorphous carbon, parylene, boron nitride, teflon, polynapthalene-N, polynapthalene-F, polyarylene ether, fluorinated polyamide, fluorocyclobutene, perfluorocyclobutene, benzocyclobutene, methylsilsesquioxane, hydrosilsesquioxane, polyarylene ethers, fluoropolymers, porous dielectrics, polyamide nanofoam, silica aerogel, fully cyclized heterocyclic polymers, and other dielectric materials as discussed in the Stamper et al. patent. In a preferred embodiment, second dielectric material 15 is a low-k dielectric with an effective dielectric constant less than 2, such as silica aerogel.

The lower dielectric constant materials 15 may be deposited using any techniques well know to those skilled in the art. The specific deposition technique normally varies depending on the type of material being used. For example, CVD methods including plasma-enhanced CVD (PECVD), high density plasma CVD (HDPCVD), and ultra low temperature thermal CVD may be used to deposit materials such as amorphous carbon, fluorinated amorphous carbon, parylene, SiCOH and porous SiCOH; and spin-on methods are typically used to deposit materials such as silica aerogel, polyarylene ethers, hydrosilsesquioxane and porous SiCOH.

Following deposition of second dielectric material 15, excess material should be removed in a planarization step so that the top surface of dielectric material 15 is coplanar with the top surface of dielectric material 12. Planarization may be accomplished using any of the aforementioned planarization techniques, including CMP or RIE etchback.

This method results in the interconnect structure shown in FIG. 1(c), which comprises layer 11 having at least one conductive interconnect 13 embedded therein and a cap overlying each conductive interconnect 13. Layer 11 comprises at least one first portion 13 and at least one second portion 15. The first portion 13 comprises a first dielectric material and has a bottom surface, sidewalls and a top surface. The second portion 15 comprises a second dielectric material and has a bottom surface, sidewalls and a top surface. The sidewalls of the second portion are in contact with the first portion, and the top surface of the second portion is coplanar with the top surface of the first portion. The bottom surface of the second portion may be coplanar with the bottom surface of the first portion and may be in contact with the substrate, in the embodiment where opening 15a extends through layer 11 to expose substrate 10.

Figure 1D:
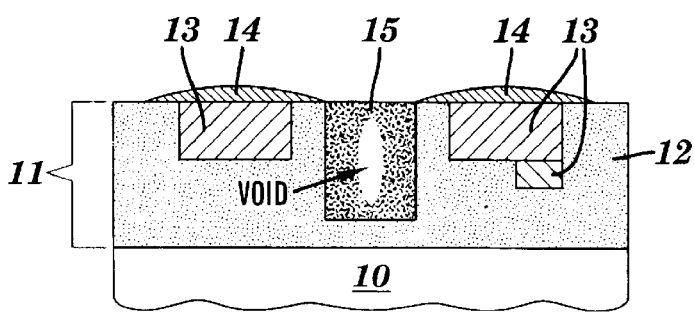

In an alternative embodiment, shown in FIG. 1(d), dielectric material 15 may incorporate one or more voids to further reduce the overall dielectric constant of layer 11. The voids may be formed by any method commonly known in the art, such as a low conformality PECVD silicon dioxide or SiCOH deposition.

A second embodiment of the invention is shown in FIGS. 2(a)–2(d). Again, the starting point for the method is an interconnect layer 21 on substrate 20. Substrate 20 may comprise lower levels of conductive interconnects or devices embedded in dielectric material (not shown). Interconnect layer 21 is formed of a first dielectric material 23 and has at least one conductive interconnect 24 embedded therein. Optionally, a cap layer 22 formed of, e.g., SiN or SiC, may be deposited on substrate 20 prior to depositing dielectric material 23.

Figure 2A:
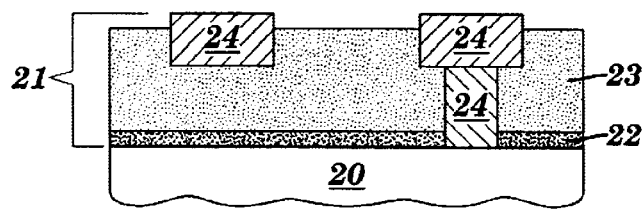
FIGS. 2(a)–2(d) illustrate a method for forming an interconnect structure in accordance with a second embodiment of the present invention.

In FIG. 2(a), conductive interconnect 24 is shown as having a top surface which is higher than the top surface of dielectric material 23. Conductive interconnect 24 may initially have a top surface which is coplanar with the top surface of dielectric material 23, and then a top portion of dielectric material 23 may be removed, thereby recessing the top surface of dielectric material 23 below the top surface of the conductive interconnect 24 and exposing a portion of the sidewalls of the conductive interconnect. Dielectric material 23 is preferably recessed about 10 nm to about 300 nm using an isotropic wet etch such as DHF, or using a RIE etchback with, e.g., a perfluorocarbon (PFC)/$O_2$ based chemistry.

The dielectric material 23 may be any suitable dielectric material, but is preferably a material having a relatively high dielectric constant, such as $SiO_2$, FSG or SiCOH, so as to provide relatively good mechanical support for the conductive interconnects 24. Conductive interconnects 24 may be formed of any suitable conductive material, but are preferably formed of copper. Layer 21, including dielectric material 23 and embedded conductive interconnect 24, may be formed using a conventional dual damascene technique, as described previously.

Figure 2B:
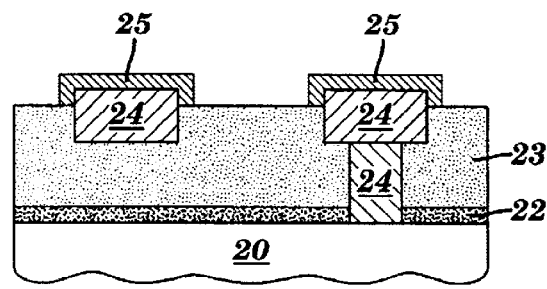

Next, a cap 25 is formed on each interconnect 24, as shown in FIG. 2(b). The cap 25 has a lateral extent greater than that of the conductive interconnect 24, thereby masking portions of the dielectric layer adjacent to each conductive interconnect and leaving other portions of the dielectric layer unmasked. The cap 25 preferable extends about 10 nm to about 50 nm beyond the top edge of the interconnect 24, and can act as a hardmask for subsequent etchback of the dielectric 23. The cap 25 may be formed by the same techniques and of the same materials as described for cap 14.

Figure 2C:
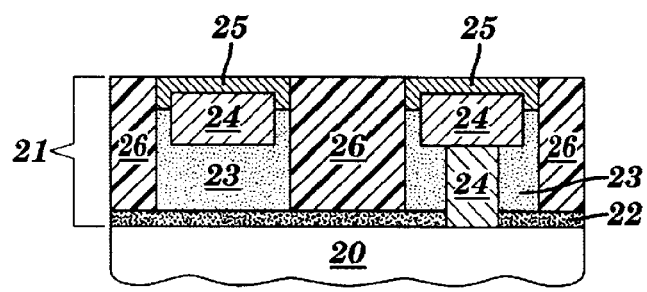

A portion of first dielectric material 23 is then etched back in areas of layer 21 not masked by cap 25, and the openings formed by such etchback are filled with a second dielectric material 26, as shown in FIG. 2(c), using the same techniques and materials as described for FIGS. 1(b)–1(c). Again, second dielectric material 26 preferably has a lower dielectric constant than that of first dielectric material 23.

Following deposition of second dielectric material 26, excess material should be removed in a planarization step so that the top surface of dielectric material 26 is coplanar with the top surface of cap 25. Planarization may be accomplished using any of the aforementioned planarization techniques, including CMP or RIE etchback.

This method results in the interconnect structure shown in FIG. 2(c), which comprises layer 21 having at least one conductive interconnect 24 embedded therein and a cap 25 overlying each conductive interconnect 24. Layer 21 comprises at least one first portion 23 and at least one second portion 26. The first portion 23 comprises a first dielectric material and has a bottom surface, sidewalls and a top surface. The second portion 26 comprises a second dielectric material and has a bottom surface, sidewalls and a top surface. The sidewalls of the second portion 26 are in contact with the first portion 23, and the top surface of the second portion 26 is coplanar with the top surface of the cap 25. The bottom surface of the second portion 26 may be coplanar with the bottom surface of the first portion 23 and may be in contact with the substrate 20 or cap layer 22, as shown in FIG. 2(c). Alternatively, the bottom surface of the second portion 26 may be higher than the bottom surface of the first portion 23, such that the bottom surface of the second portion 26 is in contact with the first portion 23. The cap 25 overlies the first portion 23 and the conductive interconnect 24, but does not overlie the second portion 26. The top surface of the cap 25 is coplanar with the top surface of the second portion 26, and has a lateral extent greater than that of the conductive interconnect 24, such that the top surface of the first portion 23 is in contact with the cap 25 but the top surface of the second portion 26 is not in contact with the cap 25.

Again, second dielectric material 26 may incorporate one or more voids to further reduce the overall dielectric constant of layer 21. These voids or pores may be formed using any of the techniques previously described with regard to FIG. 1(d).

Figure 2D:
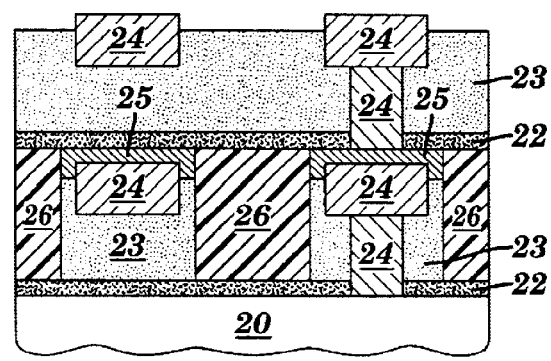

The above process may be repeated to form subsequent interconnect levels, as shown in FIG. 2(d).

Figure 3A:
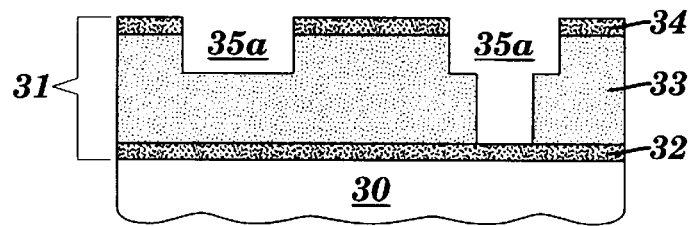
FIGS. 3(a)–3(f) illustrate a method for forming an interconnect structure in accordance with a third embodiment of the present invention.

A third embodiment of the invention is shown in FIGS. 3(a)–3(e). Again, the starting point for the method is an interconnect layer 31 on substrate 30. Substrate 30 may comprise lower levels of conductive interconnects or devices embedded in dielectric material (not shown). In FIG. 3(a), layer 31 includes a layer of first dielectric material 33 and a layer of third dielectric material 34. Optionally, a cap layer 32 formed of, e.g., SiN or SiC, may be deposited on substrate 30 prior to depositing dielectric material 33.

The layer of first dielectric material 33 may be formed of any suitable dielectric material, but is preferably a material having a relatively high dielectric constant, such as $SiO_2$, FSG or SiCOH, so as to provide relatively good mechanical support for the conductive interconnects 35. Following deposition of first dielectric material 33, a third dielectric material 34 is deposited on first dielectric material 33. Third dielectric material 34 is preferably a material having a higher etch rate than that of first dielectric material 33. If an isotropic DHF wet etch process is used, preferable materials for layer 34 include phosphosilicate glass (PSG) with 1–8 atomic % P, borophosphosilicate glass (BPSG) with 1–8 atomic % P and 1–6 atomic % B, and ozone/TEOS $SiO_2$ deposited by atmospheric pressure CVD (APCVD) or sub-atmospheric pressure CVD (SACVD), as known in the art. If a RIE etch using $N_2$ or $H_2$ is employed, layer 34 may comprise SiLK™ (an aromatic hydrocarbon thermosetting polymer available from The Dow Chemical Company), polyimide or other polymer materials. Preferable materials for layer 33 include $SiO_2$, FSG and SiCOH. Layer 34 preferably has a thickness of about 10 nm to about 100 nm.

Openings 35a are then formed in dielectric layers 33 and 34, as shown in FIG. 3(a), using conventional patterning and etching techniques. Etching is preferably carried out using any anisotropic or isotropic etch technique well know to those skilled in the art. Suitable anisotropic etching techniques include dry etching techniques and/or wet chemical etching techniques, with dry RIE being the most preferred.

Figure 3B:
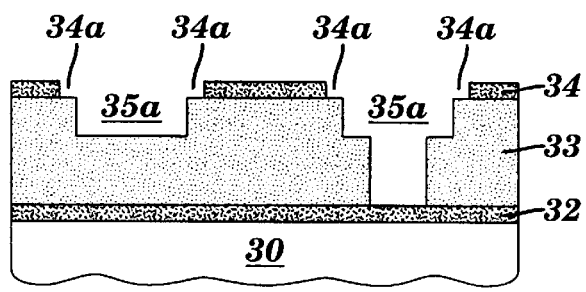

Next, the structure is exposed to an isotropic etch, as discussed above, thereby removing portions of the third dielectric material 34 adjacent to the openings 35a and exposing portions of the top surface of the first dielectric material 33, as shown in FIG. 3(b). Layer 34 is thereby pulled back, removing portions 34a of dielectric 34. The isotropic etch chemistry should be selected so as to result in removal of the upper or second dielectric layer much faster than the lower or first dielectric layer. For example, if the second dielectric layer 34 were formed of ozone/TEOS $SiO_2$, and the first dielectric layer 33 were formed of PECVD $SiO_2$, then the DHF etch selectivity would be about 30:1. In other words, 30 nm of the upper or second dielectric layer 34 would be removed while 1 nm of the lower or first dielectric layer 33 would be removed. The isotropic etch must etch the sidewalls of layer 34, and may also etch the top surface.

Figure 3C:
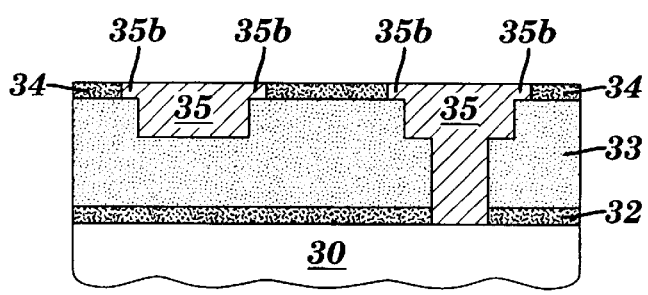

Openings 35a, including portions 34a, are then filled with a conductive material, thereby creating conductive interconnects 35. Conductive interconnects 35 may be formed of any suitable conductive material, but are preferably formed of copper. After deposition of the conductive material using conventional deposition techniques, the top surface of the conductive interconnects are made coplanar with the top surface of second dielectric layer 34, as shown in FIG. 3(c). Conductive interconnects include an overhang area 35b, and therefore the top portion has a lateral extent greater than that of lower portions of the interconnect, thereby masking portions of the layer of first dielectric material 33 adjacent to each conductive interconnect and leaving the layer of second dielectric material 34 and other portions of the layer of first dielectric material 33 not masked. Overhang area 35b preferably extends about 10 nm to about 50 nm beyond the edge of lower portions of the interconnect.

Figure 3D:
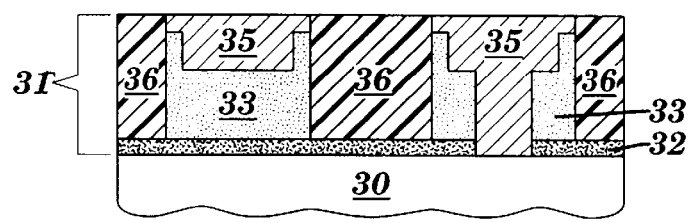

Using the overhang area 35b as a hardmask, the layer of third dielectric material 34 and a portion of the layer of first dielectric material 33 is then etched back in areas of layer 31 not masked, and the resulting openings are filled with a second dielectric material 36, as shown in FIG. 3(d), using the same techniques and materials as described for FIGS. 1(b)–1(c). Again, second dielectric material 36 preferably has a lower dielectric constant than that of first dielectric material 33.

Following deposition of second dielectric material 36, excess material should be removed in a planarization step so that the top surface of dielectric material 36 is coplanar with the top surface of interconnect 35. Planarization may be accomplished using any of the aforementioned planarization techniques, including CMP or RIE etchback.

This method results in the interconnect structure shown in FIG. 3(d), which comprises layer 31 comprising at least one first portion 33 and at least one second portion 36. The first portion 33 comprises the first dielectric material and has a bottom surface, sidewalls and a top surface. The second portion 36 comprises the second dielectric material and has a bottom surface, sidewalls and a top surface. Sidewalls of the first portion 33 are in contact with sidewalls of the second portion 36. The bottom surface of the second portion 36 may be coplanar with the bottom surface of the first portion 33 and may be in contact with the substrate 30 or cap layer 32, as shown in FIG. 3(d). Alternatively, the bottom surface of the second portion 36 may be higher than the bottom surface of the first portion 33, such that the bottom surface of the second portion 36 is in contact with the first portion 33.

The interconnect structure also comprises at least one conductive interconnect 35 embedded in the first portion 33 and having a top surface coplanar with the top surface of the second portion 36. The conductive interconnect 35 has a lateral extent greater than lower portions of the interconnect, such that the top surface of the first portion 33 is in contact with the top portion of the conductive interconnect 35 but the top surface of the second portion 36 is not in contact with the conductive interconnect.

Figure 3E:
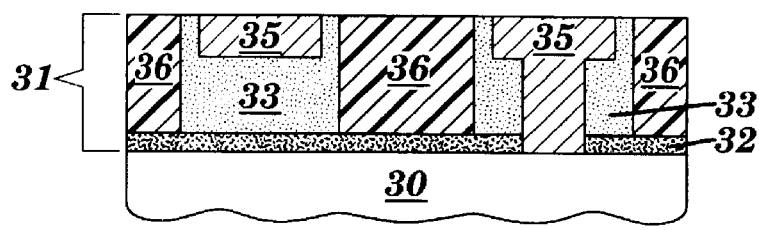

Optionally, after the structure shown in FIG. 3(d) has been formed, the top portion of conductive interconnects 35, i.e. the overhang 35b, may be removed by polishing the top surface of layer 31 down to a level below the overhang 35b, as shown in FIG. 3(e). This would result in a structure in which layer 31 comprises at least one first portion 33 and at least one second portion 36. The first portion would comprise the first dielectric material and would have a bottom surface, sidewalls and a top surface. The second portion 36 would comprise the second dielectric material and would have a bottom surface, sidewalls and a top surface. Sidewalls of the first portion 33 still would be in contact with sidewalls of the second portion 36, but the top surface of the first portion 33 would be coplanar with the top surface of the second portion 36. The conductive interconnect 35 would have a top surface coplanar with the top surface of both the first portion 33 and the second portion 36. The top portion of conductive interconnect 35 would no longer have a lateral extent greater than lower portions of the interconnect. The first dielectric material would be in contact with the entire sidewalls of the interconnect. It is desirable to remove the overhang 35b because it may tend to increase the line to line capacitance and increase the sensitivity to line to line shorts due to residual metal.

Again, second dielectric material 36 may incorporate one or more voids to further reduce the overall dielectric constant of layer 31. These voids or pores may be formed using any of the techniques previously described with regard to FIG. 1(d).

Figure 3F:
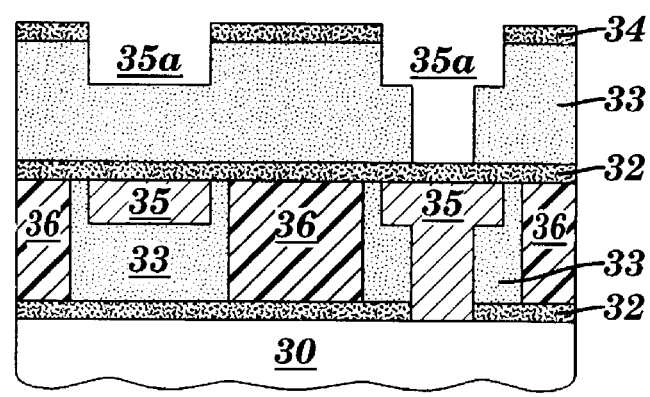

The above process may be repeated to form subsequent interconnect levels, as shown in FIG. 3(f).

A fourth embodiment of the invention is shown in FIGS. 4(a)–4(e). Again, the starting point for the method is an interconnect layer 41 on substrate 40. Substrate 40 may comprise lower levels of conductive interconnects or devices embedded in dielectric material (not shown). Layer 41 is initially formed of a first dielectric material 43. Optionally, a cap layer 42 formed of, e.g., SiN or SiC, may be deposited on substrate 40 prior to depositing dielectric material 43.

Figure 4A:
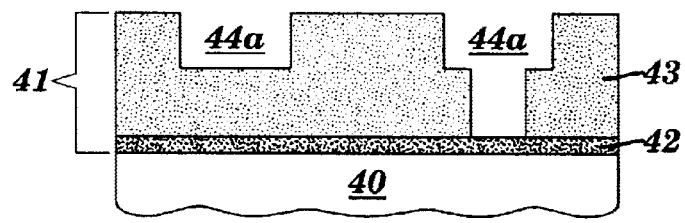
FIGS. 4(a)–4(f) illustrate a method for forming an interconnect structure in accordance with a fourth embodiment of the present invention.

The first dielectric material 43 may be any suitable dielectric material, but is preferably a material having a relatively high dielectric constant, such as $SiO_2$, SiCOH or FSG, so as to provide relatively good mechanical support for the conductive interconnects 44. Following deposition of first dielectric material 43, openings 44a are then formed in dielectric material 43, as shown in FIG. 4(a), using conventional patterning and etching techniques. Etching is preferably carried out using any anisotropic or isotropic etch technique well know to those skilled in the art. Suitable anisotropic etching techniques include dry etching techniques and/or wet chemical etching techniques, with dry RIE being the most preferred.

Figure 4B:
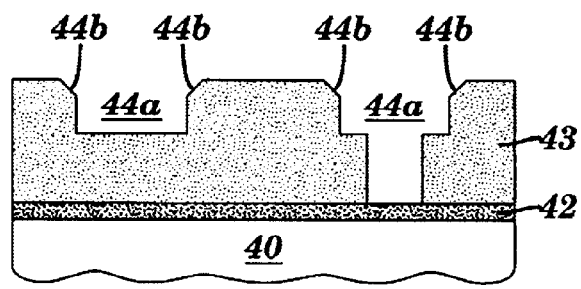

Next, the corners of openings 44a are intentionally rounded, as indicated by reference numeral 44b in FIG. 4(b). Corner rounding may be accomplished using any suitable technique. For example, prior to deposition of conductive material 44, the standard Ar or Ar/H sputter 2 pre-clean time or power may be increased. As another example, the wafer may be exposed to an isotropic etch, such as a blanket $PFC/O_2$-based SiN, SiC or SiCN RIE etch, to open up cap layer 42.

Figure 4C:
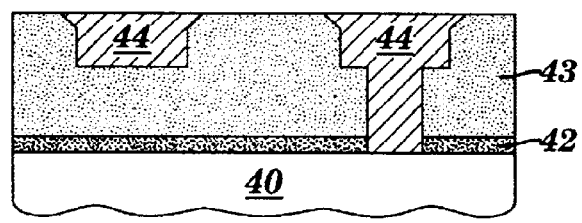

Openings 44a, including rounded corners 44b, are then filled with a conductive material, thereby creating conductive interconnects 44. Conductive interconnects 44 may be formed of any suitable conductive material, but are preferably formed of copper. After deposition of the conductive material using conventional deposition techniques, the top surface of the conductive interconnects 44 are made coplanar with the top surface of first dielectric material 43, as shown in FIG. 4(c). Conductive interconnects include an overhang area similar to the overhang area 35b shown in FIG. 3(c), and therefore the top portion has a lateral extent greater than that of lower portions of the interconnect, thereby masking portions of the first dielectric material 43 adjacent to each conductive interconnect 44 and leaving other portions of the first dielectric material 43 not masked. This top portion preferably extends about 10 nm to about 50 nm beyond the edge of lower portions of the interconnect.

Figure 4D:
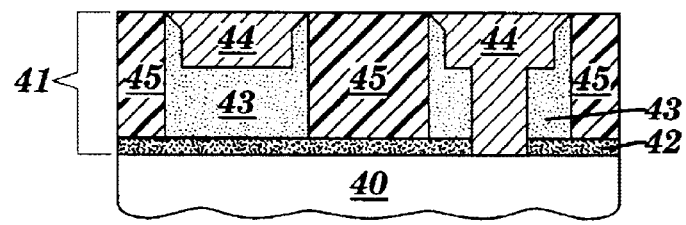

Using this top portion of the interconnect 44 as a hardmask, a portion of first dielectric material 43 is then etched back in areas of layer 41 not masked, and the resulting openings are filled with a second dielectric material 45, as shown in FIG. 4(d), using the same techniques and materials as described for FIGS. 1(b)–1(c). Again, second dielectric material 45 preferably has a lower dielectric constant than that of first dielectric material 43.

Following deposition of second dielectric material 45, excess material should be removed in a planarization step so that the top surface of dielectric material 45 is coplanar with the top surface of interconnect 44. Planarization may be accomplished using any of the aforementioned planarization techniques, including CMP or RIE etchback.

This method results in the interconnect structure shown in FIG. 4(d), which comprises layer 41 comprising at least one first portion 43 and at least one second portion 45. The first portion 43 comprises a first dielectric material and has a bottom surface, sidewalls and a top surface. The second portion 45 comprises a second dielectric material and has a bottom surface, sidewalls and a top surface. Sidewalls of the first portion 43 are in contact with sidewalls of the second portion 45. The bottom surface of the second portion 45 may be coplanar with the bottom surface of the first portion 43 and may be in contact with the substrate 40 or cap layer 42, as shown in FIG. 4(d). Alternatively, the bottom surface of the second portion 45 may be higher than the bottom surface of the first portion 43, such that the bottom surface of the second portion 45 is in contact with the first portion 43.

The interconnect structure also comprises at least one conductive interconnect 44 embedded in the first portion 43 and having a top surface coplanar with the top surface of the second portion 45. The top portion of conductive interconnect 44 has a lateral extent greater than lower portions of the interconnect, such that the top surface of the first dielectric material 43 is in contact with the top portion of the conductive interconnect 44 but the top surface of the second portion 45 is not in contact with the conductive interconnect 44.

Figure 4E:
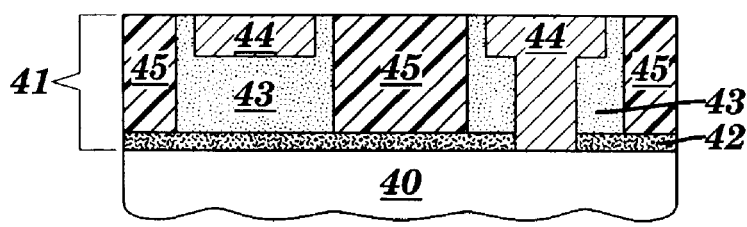

Optionally, after the structure shown in FIG. 4(d) has been formed, the top portion of conductive interconnects 44, i.e. the overhang, may be removed by polishing the top surface of layer 41 down to a level below the overhang, as shown in FIG. 4(e). This would result in a structure in which layer 41 comprises at least one first portion 43 and at least one second portion 45. The first portion 43 would comprise a first dielectric material and would have a bottom surface, sidewalls and a top surface. The second portion 45 would comprise a second dielectric material and would have a bottom surface, sidewalls and a top surface. Sidewalls of the first portion 43 still would be in contact with sidewalls of the second portion 45, but the top surface of the first portion 43 would be coplanar with the top surface of the second portion 45. The conductive interconnect 44 would have a top surface coplanar with the top surface of both the first portion 43 and the second portion 45. The top portion of conductive interconnect 44 would no longer have a lateral extent greater than lower portions of the interconnect. The first dielectric material would be in contact with the entire sidewalls of the interconnect 44. It is desirable to remove the overhang because it may tend to increase the line to line capacitance and increase the sensitivity to line to line shorts due to residual metal.

Again, second dielectric material 45 may incorporate one or more voids to further reduce the overall dielectric constant of layer 41. These voids or pores may be formed using any of the techniques previously described with regard to FIG. 1(d).

Figure 4F:
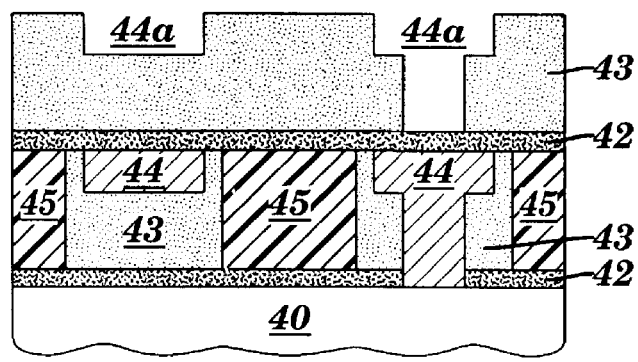

The above process may be repeated to form subsequent interconnect levels, as shown in FIG. 4(f).

While the previous description has focused on lowering the dielectric constant between conductors, this invention may also be used to increase the dielectric constant between wires. Increasing the dielectric constant would be desirable if the conductors were being used to form wire finger capacitors. To increase the capacitance of these wire finger capacitors, higher-k dielectric materials, such as $Ta_2O_5$, may be deposited as the second dielectric material (e.g., material 15 in FIG. 1(c)).

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

What is claimed is:

1. A method of forming an interconnect structure on a substrate, the method comprising the steps of:
   depositing at least one dielectric layer on the substrate, the dielectric layer being formed of at least one first dielectric material;
   embedding at least one conductive interconnect in the dielectric layer, the conductive interconnect having sidewalls in contact with the first dielectric material, wherein the conductive interconnect has a top surface coplanar with the top surface of the dielectric layer;
   removing a portion of the first dielectric material in selected areas of the dielectric layer, thereby forming at least one opening in the dielectric layer, such that the sidewalls of the conductive interconnect remain in contact with the first dielectric material, wherein the portion of the first dielectric material is removed by a method comprising the steps of:
   forming a cap on each conductive interconnect, the cap having a lateral extent greater than that of the conductive interconnect, thereby masking portions of the dielectric layer adjacent to the conductive interconnect and leaving other portions of the dielectric layer not masked; and
   removing a portion of the first dielectric material in areas of the dielectric layer not masked by the cap, thereby forming the at least one opening in the dielectric layer; and
   filling the opening with a second dielectric material.

2. The method of claim 1, wherein the second dielectric material has a dielectric constant less than that of the first dielectric material.

3. The method of claim 1, wherein the second dielectric material has a dielectric constant less than about 4.0.

4. The method of claim 1, wherein the second dielectric material has a dielectric constant of about 1.3 to about 3.5.

5. The method of claim 1, wherein the first dielectric material comprises a material selected from the group consisting of $SiO_2$, FSG and SiCOH, and the second dielectric material comprises a material selected from the group consisting of amorphous carbon, fluorinated amorphous carbon, parylene, boron nitride, teflon, polynapthalene-N, polynapthaleneF, polyarylene ether, fluorinated polyamide, fluorocyclobutene, perfluorocyclobutene, benzocyclobutene, methylsilsesquioxane, hydrosilsesquioxane, polyarylene ethers, fluorpolymers, polyamide nanofoam, silica aerogel, fully cyclized heterocyclic polymers, SiCOH and porous SiCOH.

6. The method of claim 1, wherein the second dielectric material includes at least one void.

7. The method of claim 1, wherein the second dielectric material is a porous dielectric material.

8. The method of claim 1, wherein the conductive interconnect is formed of copper.

9. The method of claim 1, wherein the second dielectric material has a dielectric constant greater than that of the first dielectric material.

10. The method of claim 1, wherein the cap is formed of CoNiP or CoWP, and is formed by selective electroless plating.

11. The method of claim 1, wherein the cap is formed of tungsten, and is formed by selective CVD metal deposition.

12. The method of claim 1, wherein the cap has a lateral extant of about 10 nm to about 50 nm greater than that of the conductive interconnect.

13. A method of forming an interconnect structure on a substrate, the method comprising the steps of:
    depositing at least one dielectric layer on the substrate, the dielectric layer being formed of at least one first dielectric material;
    embedding at least one conductive interconnect in the dielectric layer, the conductive interconnect having sidewalls in contact with the first dielectric material, wherein the conductive interconnect has a top surface and sidewalls, and the top surface is higher than the top surface of the first dielectric material, thereby exposing a top portion of the sidewalls;
    removing a portion of the first dielectric material in selected areas of the dielectric layer thereby forming at least one opening in the dielectric layer, such that the sidewalls of the conductive interconnect remain in contact with the first dielectric material, wherein the portion of the first dielectric material is removed by a method comprising the steps of:
        forming a cap on the top surface and exposed sidewalls of each conductive interconnect, the cap having a lateral extent greater than that of the conductive interconnect, thereby masking portions of the dielectric layer adjacent to each conductive interconnect and leaving other portions of the dielectric layer not masked; and
        removing a portion of the first dielectric material in areas of the dielectric layer not masked by the cap, thereby forming the at least one opening in the dielectric layer; and
    filling the opening with a second dielectric material.

14. The method of claim 13, wherein the top surface of the conductive interconnect is initially coplanar with the top surface of the first dielectric material, and the top surface of the conductive interconnect is made higher than the top surface of the first dielectric material by removing a top portion of the first dielectric material, thereby recessing the top surface of the first dielectric material below the top surface of the conductive interconnect and exposing a top portion of the sidewalls of the conductive interconnect.

15. The method of claim 14, wherein the top surface of the conductive interconnect is made higher than the top surface of the first dielectric material by removing a top portion of about 10 nm to about 300 nm of the first dielectric material.

16. The method of claim 13, wherein the cap is formed of CoNiP or CoWP, and is formed by selective electroless plating.

17. The method of claim 13, wherein the cap is formed of tungsten, and is formed by selective CVD metal deposition.

18. The method of claim 13, wherein the top surface of the conductive interconnect is about 10 nm to 300 nm higher than the top surface of the first dielectric material.

19. The method of claim 13, wherein the cap has a lateral extent of about 10 nm to about 50 nm greater than that of the conductive interconnect.

20. The method of claim 13, wherein the second dielectric material has a dielectric constant less than that of the first dielectric material.

21. The method of claim 13, wherein the second dielectric material has a dielectric constant less than about 4.0.

22. The method of claim 13, wherein the second dielectric material has a dielectric constant of about 1.3 to about 3.5.

23. The method of claim 13, wherein the first dielectric material comprises a material selected from the group consisting of $SiO_2$, FSG and SiCOH, and the second dielectric material comprises a material selected from the group consisting of amorphous carbon, fluorinated amorphous carbon, parylene, boron nitride, teflon, polynapthalene-N, polynapthalene-F, polyarylene ether, fluorinated polyamide, fluorocyclobutene, perfluorocyclobutene, benzocyclobutene, methylsilsesquioxane, hydrosilsesquioxane, polyarylene ethers, fluorpolymers, polyamide nanofoam, silica aerogel, fully cyclized heterocyclic polymers, SiCOH and porous SiCOH.

24. The method of claim 13, wherein the second dielectric material includes at least one void.

25. The method of claim 13, wherein the second dielectric material is a porous dielectric material.

26. The method of claim 13, wherein the conductive interconnect is formed of copper.

27. The method of claim 13, wherein the second dielectric material has a dielectric constant greater than that of the first dielectric material.

28. A method of forming an interconnect structure on a substrate, the method comprising the steps of:
    depositing at least one dielectric layer on the substrate, the dielectric layer being formed of at least one first dielectric material;
    embedding at least one conductive interconnect in the dielectric layer, the conductive interconnect having sidewalls in contact with the first dielectric material, wherein the conductive interconnect is embedded in the dielectric layer by a method comprising the steps of:
        forming at least one first opening in the dielectric layer;
        removing a top portion of the dielectric material adjacent to the first opening, thereby rounding top corners of the first opening; and
        filling the first opening with a conductive material, thereby forming at least one conductive interconnect the conductive interconnect having a top surface coplanar with the top surface of the dielectric layer, and a top portion having a lateral extent greater than that of lower portions of the conductive interconnect, thereby masking portions of the dielectric layer adjacent to the conductive interconnect and leaving other portions of the dielectric layer not masked; and removing a portion of the first dielectric material in selected areas of the dielectric layer, thereby forming at least one opening in the dielectric layer, such that the sidewalls of the conductive interconnect remain in contact with the first dielectric material, wherein the portion of the first dielectric material is removed by a method comprising the step of:

removing a portion of the first dielectric material in areas of the dielectric layer not masked by the top portion of the conductive interconnect, thereby forming at least one second opening in the dielectric layer; and filling the opening with a second dielectric material.

29. The method of claim 28, wherein the top corners of the first opening are rounded by a sputter pre-clean using Ar or Ar/$H_2$.

30. The method of claim 28, wherein the top corners of the first opening are rounded by exposing the structure to an isotropic etch.

31. The method of claim 28, wherein the top portion of the conductive interconnect has a lateral extent of about 10 nm to about 50 nm greater than lower portions of the conductive interconnect.

32. The method of claim 28, further comprising the step of removing the top portion of the conductive interconnect and a top portion of the second dielectric material, such that the top surface of the conductive interconnect is made coplanar with the top surface of the first portion and the top surface of the second portion.

33. The method of claim 28, wherein the second dielectric material has a dielectric constant less than that of the first dielectric material.

34. The method of claim 28, wherein the second dielectric material has a dielectric constant less than about 4.0.

35. The method of claim 28, wherein the second dielectric material has a dielectric constant of about 1.3 to about 3.5.

36. The method of claim 28, wherein the first dielectric material comprises a material selected from the group consisting of $SiO_2$, FSG and SiCOH, and the second dielectric material comprises a material selected from the group consisting of amorphous carbon, fluorinated amorphous carbon, parylene, boron nitride, teflon, polynapthalene-N, polynapthalene-F, polyarylene ether, fluorinated polyamide, fluorocyclobutene, perfluorocyclobutene, benzocyclobutene, methylsilsesquioxane, hydrosilsesquioxane, polyarylene ethers, fluoropolymers, polyamide nanofoam, silica aerogel, fully cyclized heterocyclic polymers, SiCOH and porous SiCOH.

37. The method of claim 28, wherein the second dielectric material includes at least one void.

38. The method of claim 28, wherein the second dielectric material is a porous dielectric material.

39. The method of claim 28, wherein the conductive interconnect is formed of copper.

40. The method of claim 28, wherein the second dielectric material has a dielectric constant greater than that of the first dielectric material.

* * * * *